(12) United States Patent
Chang et al.

(10) Patent No.: US 9,876,979 B1
(45) Date of Patent: Jan. 23, 2018

(54) CURRENT GENERATOR

(71) Applicant: OMNIVISION TECHNOLOGIES, INC., Santa Clara, CA (US)

(72) Inventors: Chun-Hsiang Chang, San Jose, CA (US); Yu-Shen Yang, San Jose, CA (US); Yingkan Lin, San Jose, CA (US); Liping Deng, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/371,009

(22) Filed: Dec. 6, 2016

(51) Int. Cl.
| | | |
|---|---|---|
| H01L 27/146 | (2006.01) |
| H03B 5/12 | (2006.01) |
| H03B 5/36 | (2006.01) |
| H04N 5/378 | (2011.01) |
| G05F 1/575 | (2006.01) |
| H04N 5/374 | (2011.01) |
| H04N 5/953 | (2006.01) |

(52) U.S. Cl.
CPC ............. *H04N 5/378* (2013.01); *G05F 1/575* (2013.01); *H01L 27/14643* (2013.01); *H03B 5/1271* (2013.01); *H03B 5/366* (2013.01); *H04N 5/374* (2013.01); *H04N 5/953* (2013.01); *H03B 2201/0275* (2013.01)

(58) Field of Classification Search
None
See application file for complete search history.

(56) References Cited

U.S. PATENT DOCUMENTS

| | | | |
|---|---|---|---|
| 7,495,465 B2 | 2/2009 | Khan et al. | |
| 7,514,989 B1 | 4/2009 | Somerville et al. | |
| 8,419,274 B2 | 4/2013 | Chen et al. | |
| 8,710,930 B2 * | 4/2014 | Tan | H03K 3/02 331/185 |

OTHER PUBLICATIONS

Chen et al., "Fully On-Chip Temperature, Process, and Voltage Sensors," Proc. IEEE Int'l. Symp. on Circuits and Systems, pp. 897-900 (2010).
Khan et al., "Techniques for On-Chip Process Voltage and Temperature Detection and Compensation," International Conference on VLSI Design, 6 pages (2006).

\* cited by examiner

*Primary Examiner* — Mark T Monk
(74) *Attorney, Agent, or Firm* — Christensen O'Connor; Johnson Kindness PLLC (57) ABSTRACT

An example current generator may include a low dropout regulator (LDO) coupled to receive a reference voltage and provide a reference current in response, where the LDO adjusts a current level of the current reference in response to a calibration signal. A current controlled oscillator coupled to receive a reference current copy from the LDO and generate an oscillating signal in response, where a period of the oscillating signal is based at least in part on a level of the reference current copy. A pulse generator coupled to provide an adjustable pulse signal. A counter coupled to determine a number of periods of the oscillating signal occurring during a duration of the pulse signal, and provide a control signal indicative of such, and a digital calibration circuit coupled to receive the control signal and provide the calibration signal to the LDO in response.

20 Claims, 4 Drawing Sheets

CURRENT GENERATOR

TECHNICAL FIELD

This disclosure relates generally to image sensors, and in particular but not exclusively, relates to an accurate current generator for CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Many image sensors use reference currents to set operating points for various functional blocks. The reference currents may be generated based on one or more reference voltages, for example. Additionally, the circuits that generate the reference currents may conventionally include one or more resistors that provide a feedback voltage. The resistors, however, may be characterized as having large variation in resistance values, around 20% for example, which may affect the level of the reference currents. If the reference current is off from a desired level, the image sensor may not operate as intended.

Many techniques have been employed to mitigate the effects of the resistor variation of image sensor performance. However, some of these methods may not entirely eliminate the effects of resistance variation.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with a floating diffusion operation to obtain low dark current are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
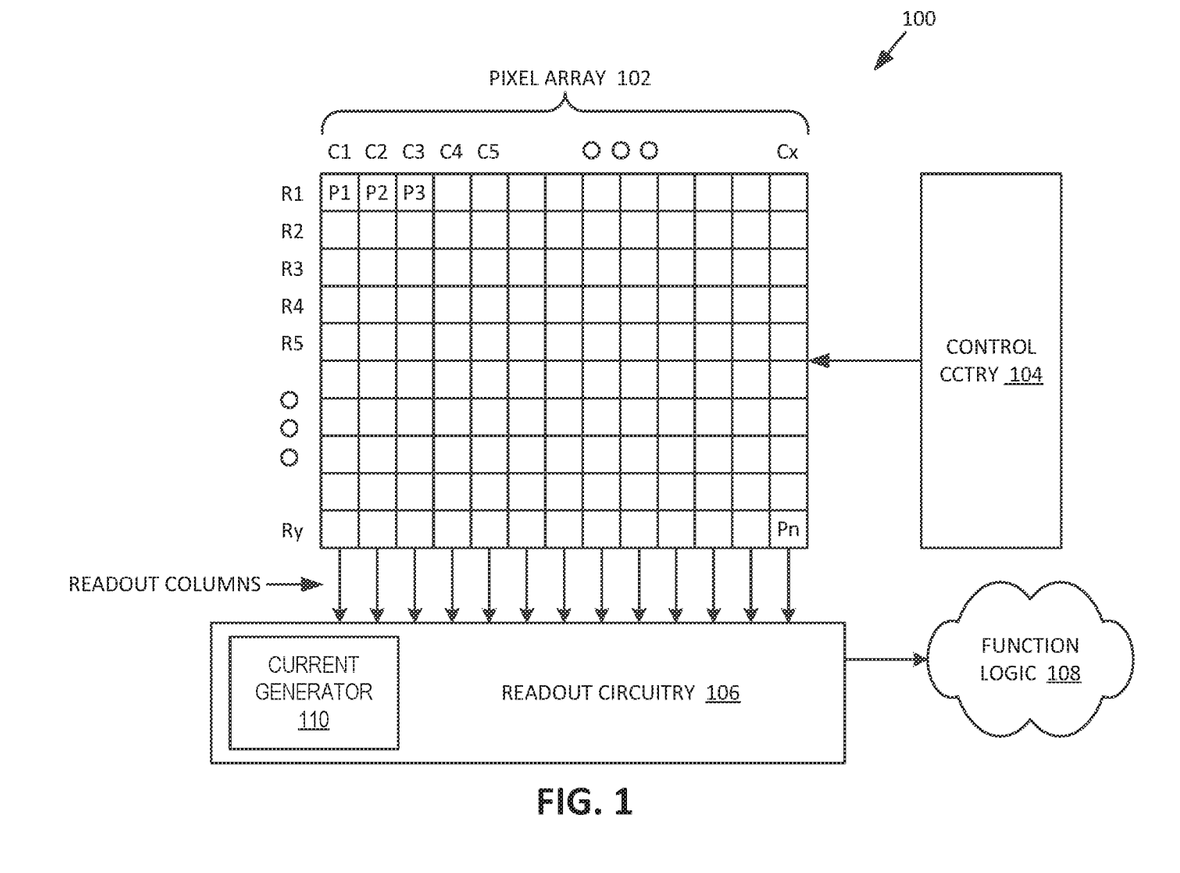
FIG. 1 illustrates one example of an imaging system 100 according to an embodiment of the present disclosure.

FIG. 1 illustrates one example of an imaging system 100 according to an embodiment of the present disclosure. Imaging system 100 includes pixel array 102, control circuitry 104, readout circuitry 106, and function logic 108. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 106 and then transferred to function logic 108. Readout circuitry 106 may be coupled to readout image data from the plurality of photodiodes in pixel array 102. In various examples, readout circuitry 106 may include amplification circuitry, analog-to-digital (ADC) conversion circuitry, or otherwise. Function logic 108 may simply store the image data or even manipulate the image data by applying post image effects (e.g., crop, rotate, remove red eye, adjust brightness, adjust contrast, or otherwise). In one example, readout circuitry 106 may readout a row of image data at a time along readout column lines (illustrated) or may readout the image data using a variety of other techniques (not illustrated), such as a serial readout or a full parallel readout of all pixels simultaneously.

In one example, a current generator 110 may provide one or reference currents to the readout circuitry 106. While FIG. 1 depicts the current generator 110 as being included in the readout circuitry 106, the current generator 110 may be included with other functional blocks of the imaging system 100 and provide one or more reference currents to the readout circuitry 106 instead. In some embodiments, the one or more reference currents may be used as biasing references by analog or mixed signal circuits of the readout circuitry 106. For example, an ADC may be provided a reference current to use as a reference for performing analog-to-digital conversions.

In some embodiments, the current generator 110 may desirably provide accurate reference currents to ensure the preciseness of the analog and mixed-signal functional circuits. The accurateness of the reference current may be influenced by one or more resistors included in the current generator 110. To overcome changes in the level of the reference currents changing or being outside of a desired threshold, the current generator 110 may include a calibration loop coupled to periodically change one or more trim transistors of the current generator 110. By changing the trim transistors, such as disabling one or more and/or enabling one or more, the level of the reference current may be adjusted in real time.

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
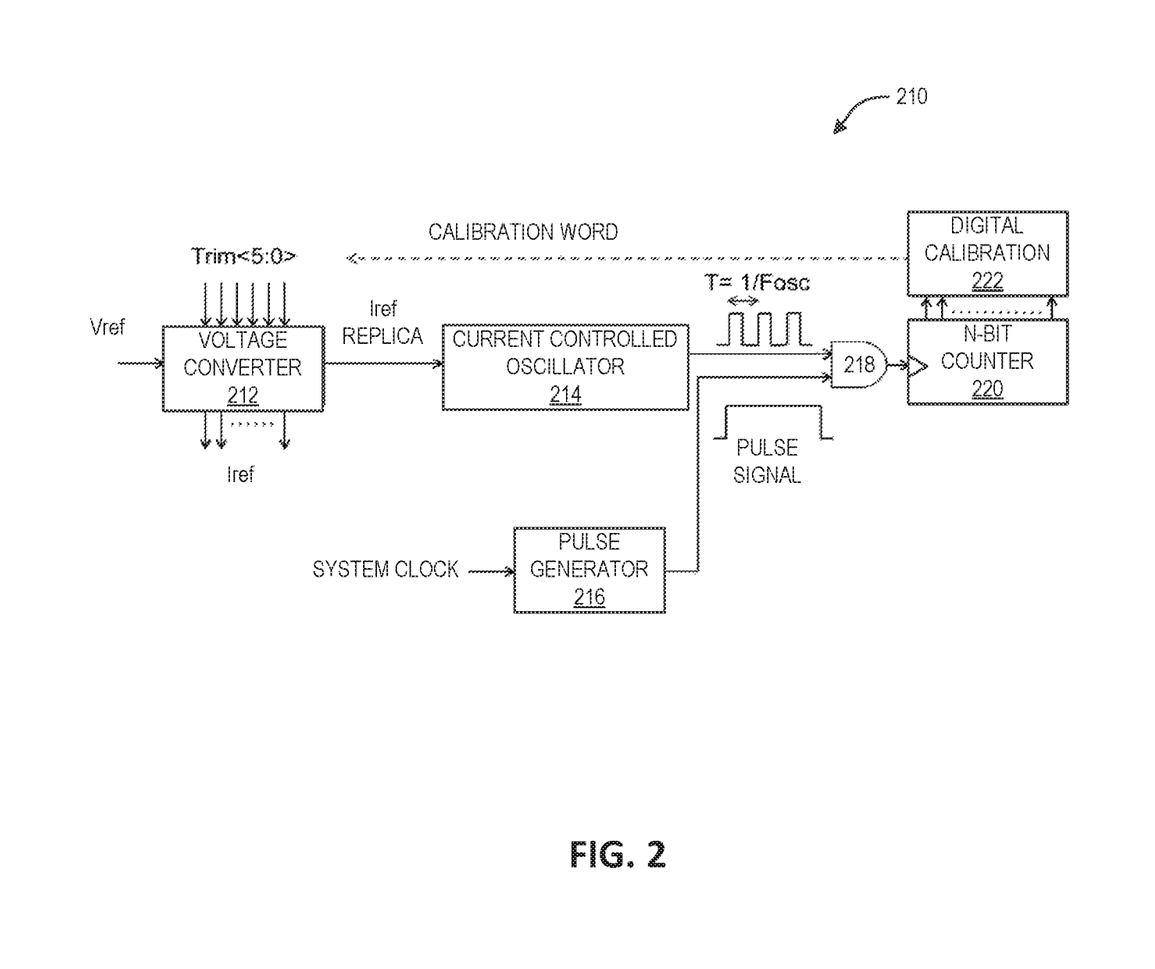
FIG. 2 is an illustrative block diagram of a current generator in accordance with an embodiment of the present disclosure.

FIG. 2 is an illustrative block diagram of a current generator 210 in accordance with an embodiment of the present disclosure. The current generator 210 may be an example of the current generator 110. The current generator 210 may receive a reference voltage and generate a reference current in response. The reference voltage, in some embodiments, may be a bandgap-based voltage, but other voltage references are also contemplated and within the scope of the present disclosure. The reference current may be mirrored a plurality of times to provide a plurality of reference currents to various circuitry, such as analog and mixed-signal circuits of the readout circuitry 106, for example. Additionally, a replica of Tref may be provided to a calibration loop for providing feedback to the voltage converter 212.

The illustrated embodiment of the current generator 210 includes a voltage converter 212, a current controlled oscillator (CCO) 214, a pulse generator 216, a logic gate 218, an n-bit counter 220, and a digital calibration 222. The voltage converter 212 may receive a reference voltage Vref and provide a plurality of reference currents in response, such as Tref. The voltage converter 212 may also receive feedback in the form of a calibration word Trim<X:0>, which may adjust a level of Tref. The length of the calibration word, while shown as six bits in FIG. 2, may be based on a number of trim transistors included in the voltage converter 212, and any number is within the scope of the present disclosure.

At least one of the reference currents may be provided to the CCO 214. The CCO 214 provides an oscillating signal in response to Tref. In some embodiments, the Tref received by the CCO 214 may also be referred to a "current replica" of the Tref generated by the voltage converter 212. The oscillating signal may have a period/frequency based at least in part on the level of Tref. The pulse generator 216 may be coupled to receive a system clock and provide at least a pulse signal in response. The system clock may be around 12 MHz, for example. The pulse signal and the oscillating signal may be received by the logic gate 218, which may be an AND gate in some embodiments. The AND gate may provide a signal in response, and the signal may be an image of the oscillating signal while the pulse signal is at a high logic level. The output of the logic gate 218 may be characterized as an image of the oscillating signal because the output of the logic gate 218 may provide a high each time the oscillating signal is high.

The n-bit counter 220 is coupled to receive the output of the logic gate 218, and may determine the number of pulses of the oscillating signal that occurs during the pulse signal. In some embodiments, there may be around 600 pulses of the oscillating signal that occur during the pulse signal. The n-bit counter 220 then provides the count to the digital calibration 222. In response, the digital calibration determines a calibration word Trim<5:0> to provide to the voltage converter 212. The calibration word may determine a number of and a mix of trim transistors of the voltage converter 212 to enable/disable. Which trim transistors are enabled and the number of them enabled will alter the level of the reference current Tref, for example.

In some embodiments, the voltage converter 212 may be a low dropout regulator coupled to receive Vref and generate a base current in response. Additionally, the voltage converter 212 may include a plurality of current mirrors to mirror a base current, and provide the mirrored base current as Tref. In some embodiments, Vref may be provided by a bandgap reference voltage generator. The voltage generator 212 may include a trim transistor corresponding to each bit of the calibration word Trim<5:0>. Each bit of Trim<5:0> may determine which trim transistor to enable/disable. Accordingly, a six-bit calibration word may enable/disable six different trim transistors, and 128 different trim transistor combinations are possible.

In some embodiments, the CCO 214 may be a ring oscillator that can adjust its oscillating time based on the level of Tref. For example, the CCO 214 may include an odd number of inverters coupled to receive Tref at a source of associated PMOS transistors, and further coupled as a ring oscillator. A signal may begin to oscillate in the CCO 214 at a rate dependent upon the level of Tref. As such, the oscillating signal may have a frequency Fosc indicative of the level of Tref.

The pulse generator 216 may be coupled to receive the system clock and provide one or more pulses in response. The pulse generator may provide a single pulse, or a continuous train of pulses. The pulse generator 216 may also be able to adjust the width of the pulse to account for various processing aspects. Additionally, the output of a first pulse after a system reset may be delayed to allow for other voltages and currents to stabilize.

The n-bit counter 220 may receive the output of the logic gate 218 and count the number of pulses received. In some embodiments, the pulses may only be received while the pulse signal is at a high logic value, e.g., a "1." The n-bit counter 218 may have a desired value stored, such as 600, and compare the counted value to the stored value. A positive or negative difference may be provided to the digital calibration 222, for example. Based on the difference provided by the n-bit counter 220, the digital calibration 222 may determine a mix of trim transistors in the voltage converter to enable to change Tref. The changed Tref may be closer to a desired value for Tref. In some embodiments, the default trim may be <100000>, which may be changed by a calibration word provided by the digital calibration 222.

Figure 3:
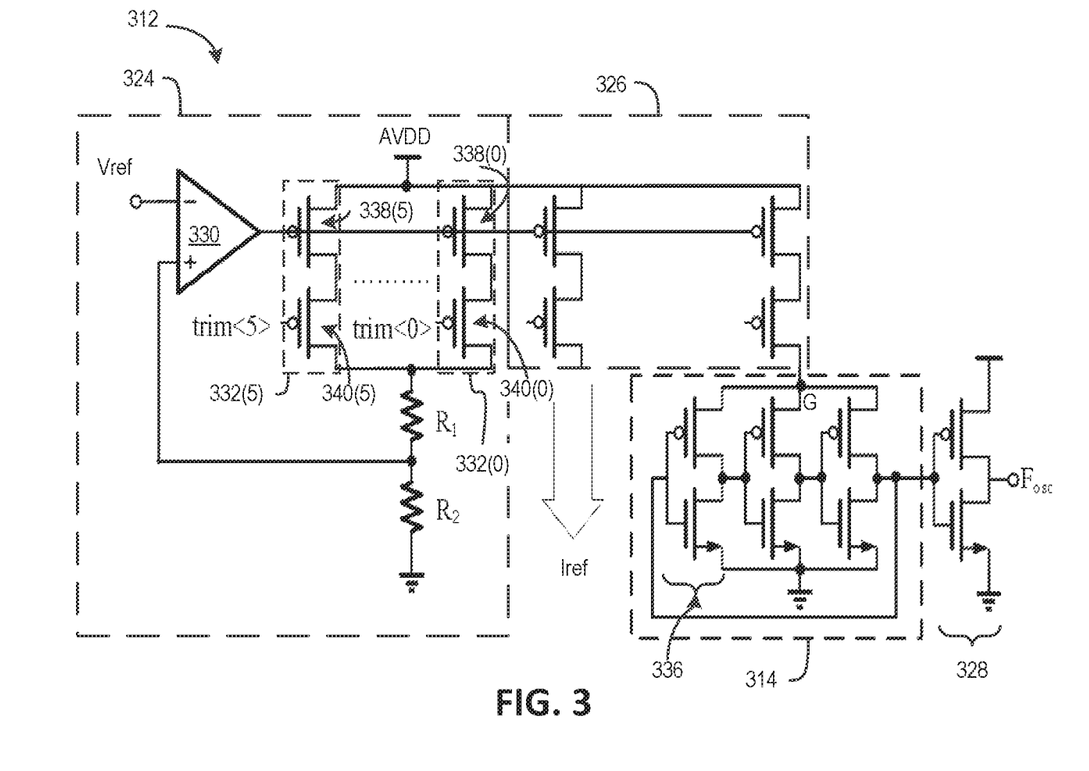
FIG. 3 is an example schematic of a voltage to current converter in accordance with an embodiment of the present disclosure.

FIG. 3 is an example schematic of a voltage converter 312 and a current controlled oscillator 314 in accordance with an embodiment of the present disclosure. The voltage converter 312 may be an example of the voltage converter 212, and the CCO 314 may be an example of the CCO 214. The voltage converter 312 may receive a reference voltage Vref and generate one or more reference currents Tref in response. A copy of the reference current may be provided to the CCO 314, which may provide an oscillating signal in response. A frequency of the oscillating signal may be indicative of the level of Tref.

The illustrated embodiment of the voltage converter 312 includes a low dropout regulator (LDO) 324, and a plurality of current mirrors 326. The illustrated embodiment of the LDO 324 includes an amplifier 330, a plurality of trim branches 332, and two resistors R1 and R2. Each current mirror of the plurality of current mirrors 326 may mirror the current provided by the combination of the plurality of trim branches 332. Further, each of the plurality of current mirrors 326 may include two PMOS transistors coupled together by respective source and drain terminals with one PMOS transistor coupled to a high reference voltage AVDD at a source terminal, and the other PMOS transistor providing Iref at a drain terminal. Each of the plurality of current mirrors 326 may be providing Iref at the same current level as generated by the LDO 324.

In the illustrated embodiment of the LDO 324, each trim branch 332(X) includes two PMOS transistors —338(X) and 340(X). The X in the labels denotes the trim branch number and is also associated with an associated bit in a calibration word Trim<X:0>. In some embodiments, the calibration word may be Trim<5:0>, which includes six bits. As such, for the illustrated embodiment, there may be six trim branches 332(X), which would include 332(0), 332(1), 332(2) . . . 332(5), with each trim branch including a PMOS transistor 338(X) and PMOS transistor 340(X). It should be noted, however, that the present disclosure is not limited to six trim branches, and any number is contemplated. The PMOS transistors 340(X) may also be referred to as a "trim transistor" as used herein, which may be selectively enabled/disabled to alter which trim branches 332(X) are enabled and how many, for example. Additionally, each trim transistor 340(X) may be formed of a different size, e.g., channel length and/or width, so that each one provides a different amount of current given the same operating conditions.

Each trim branch 332(X) may be coupled between a high voltage reference AVDD and a first side of the resistor R1. For example, a source terminal of the transistors 338(X) may be coupled to AVDD, and a drain terminal of the transistors 338(X) may be coupled to a source terminal of the trim transistors 340(X). A drain terminal of the trim transistors 340(X) may be coupled to the first side of R1. A gate terminal of the transistors 338(X) may be coupled to an output of the amplifier 330. A gate terminal of the trim transistors 340(X) may be coupled to receive a respective control signal based on the calibration word. For example, trim transistor 340(5) may be coupled to receive a control signal associated with the sixth bit of the calibration word Trim<5:0>, such as trim<5>. The bits of the calibration word may determine which of the trim transistors 340(X) are enabled/disabled. For example, a "1" in a corresponding bit location may cause the associated trim transistor 340(X) to be enabled, whereas a "0" may cause it to be disabled. Of course, the opposite association may also be implemented in an embodiment.

The two resistors R1 and R2 may be coupled in series between the trim branches 332(X) and a low reference voltage, such as ground. Additionally, a node formed between R1 and R2 may be coupled to a non-inverting input of the amplifier 330. The inverting input of the amplifier 330 may be coupled to receive the reference voltage Vref. The two resistors R1 and R2 form a voltage divider and the voltage on the node formed between R1 and R2 provides feedback to the amplifier 330. In some embodiments, the values of R1 and R2 may widely vary from device to device, which may cause undesirable variations to Tref. As such, continuous feedback may be received by the LDO 324 to adjust the number of and/or the mix of the trim transistors 340(X) enabled.

The CCO 314 may include an odd number of inverters 336 coupled into a ring oscillator with an output of each inverter 336 coupled to an input of a subsequent inverter 336. While only three inverters 336 are shown in FIG. 3, any odd number of inverters may be used. An output of the CCO 314 may be provided to an output inverter 328, which may be optional. An output of the output inverter 328 may provide the oscillating signal having a frequency Fosc.

Each of the inverters 336 may include a PMOS transistor and an NMOS transistor coupled between a node G and a low reference voltage, such as ground. For example, a source terminal of the PMOS transistor may be coupled to node G, and a drain terminal of the PMOS transistor may be coupled to a drain terminal of the NMOS transistor. A source terminal of the NMOS transistor may be coupled to the low reference voltage. Gate terminals of the PMOS and NMOS transistors may be coupled together and form the input of the inverter 336. Additionally, the coupled drain and source terminals of the PMOS and NMOS transistors may form the output of the inverter 336. In some embodiments, the PMOS and NMOS transistors of the inverters 336 may have extra-large widths and/or lengths, at least with respect to the other transistors of the voltage converter 312, which may make them less immune to changes in processing.

In some embodiments, node G may be coupled to one current mirror of the plurality of current mirrors 326. As such, node G may be coupled to receive a copy/replica of Tref. Accordingly, the PMOS transistors of each of the inverters 336 may receive Iref at a source terminal. The level of Iref may affect the latency, e.g., rising and falling times, of the inverters 336. Altering the latency of the inverters 336 may affect the frequency Fosc.

In operation, the trim transistors 340(X) may begin in a default state after a system reset. For example, the default setting may have trim transistor 340(5) enabled and the remaining trim transistors 340(0-4) disabled. With trim transistor 340(5) enabled, a current may begin to flow into the voltage divider formed by R1 and R2, which will develop a voltage on the node between R1 and R2. The voltage may be provided to the non-inverting input of the amplifier 330, which may cause an output voltage to change based on the difference between Vref and the voltage on the non-inverting input. The change in output voltage of the amplifier 330 may change a voltage on the gate terminal of transistor 338(5), which may affect the current flowing through the trim branch 332(5). Concurrently, Tref may begin to settle and may be provided by each of the plurality of current mirrors 326.

Additionally, the CCO 314 may receive the replica of Tref at node G. The CCO 314 may begin to have a signal propagating through the ring oscillator formed by the inverters 336. The signal propagating through the inverters 336 may begin without external perturbation due to inherent imbalances in the transistors of the inverters 336, where the inherent imbalance may stem from imperfect circuit balance in any one of the three inverters 336. As such, an oscillating signal may be formed due to the propagation of the signal through the inverters 336. Further, the level of Tref flowing into node G and into the inverters 336 may alter the latency of the inverters 336. In turn, Fosc of the oscillating signal may change accordingly. After a system reset, the currents and voltages in the voltage inverter 312 and the CCO 314 may take some finite amount of time to stabilize, which may also affect the time for Fosc to stabilize.

Figure 4:
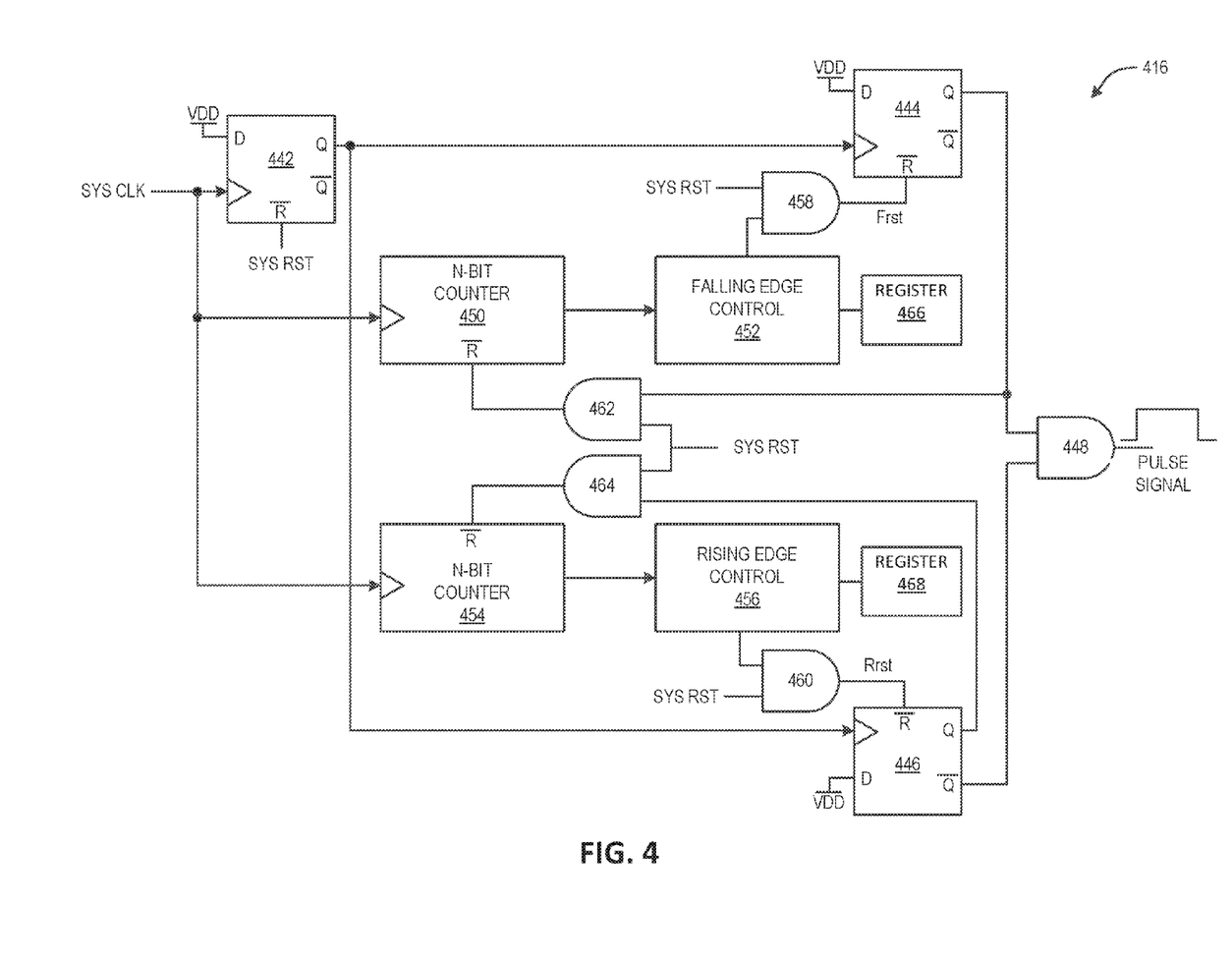
FIG. 4 is an example block diagram of a pulse generator in accordance with an embodiment of the present disclosure.

FIG. 4 is an example block diagram of a pulse generator 416 in accordance with an embodiment of the present disclosure. The pulse generator 416 may be one example of the pulse generator 216. The pulse generator 416 may provide one or more pulses based on a system clock and further based on variable count thresholds. In general, the variable count thresholds may be adjusted based on a wait time for the voltages and currents to stabilize after a system reset, and further based on a desired width for the pulse signal. In some embodiments, it may be desirable for the pulse to be around 120 microseconds long. The 120 microseconds may be roughly equivalent to 600 periods of a 5 MHz signal, which may be the frequency of the oscillating signal provided by a CCO, such as the CCO 214.

The illustrated embodiment of the pulse generator 416 includes three D flip flops 442, 444, and 446, two n-bit counters 450 and 454, a falling edge control 452, a rising edge control 456, two registers 466 and 468, and five AND gates 448 and 458-464. In some embodiments, the pulse generator 416 may be coupled to receive a system clock signal SYS CLK, and a system reset signal SYS RST. The system clock and system reset signals may be provided by an imaging system that includes the pulse generator 416, such as imaging system 100, or by a host system that includes the imaging system. In some embodiments, the system clock may be a 12 MHz clock signal. In some embodiments, the system reset signal may be an active low signal.

The D flip flop 442 may be coupled to receive SYS CLK at a timing input and may be coupled to a high reference voltage, such as VDD, at a data input D. The high reference voltage may represent a logic level "1," for example. A reset bar R\ input of the D flip flop 442, that resets on a low signal for example, may be coupled to receive SYS RST. In operation, a non-inverting output Q of the D flip flop 442 may transition to a high voltage on a rising edge of SYS CLK, and may be reset to a low voltage upon a system reset, e.g., when SYS RST pulses or transitions to low.

The D flip flop 444 may be coupled to receive the output of the D flip flop 442 at a timing input, and further coupled to the representative logic level high at a data input D. A reset bar R\ input may be coupled to receive a Frst signal from AND gate 458. In operation, a non-inverting output Q of the D flip flop 444 may transition to a high voltage on a rising edge of the output from the D flip flop 442, and may be reset to a low voltage upon Frst transitioning to low. The D flip flop 444 may control the falling edge of the pulse signal provided by the pulse generator 416, and may be reset in response to Frst.

The D flip flop 446 is coupled similarly to D flip flop 444, but provides two outputs—one form the inverting output Q\ and one from the non-inverting output Q. Additionally, a reset bar input R\ may be coupled to receive a Rrst signal from AND gate 460. In operation, the non-inverting and inverting outputs Q and Q\, respectively, of the D flip flop 446 may transition to high and low, respectively, upon a rising edge of the output from D flip flop 442. Further, D flip flop 446 may be reset upon Rrst transitioning low. The D flip flop 446 may control the rising edge of the pulse signal provided by the pulse generator 416, and may be reset in response to Rrst.

The n-bit counter 450 may be coupled to receive the system clock signal SYS CLK at a timing input and further coupled to receive a reset signal from AND gate 462. The n-bit counter 450 may, between resets at least, count the number of cycles of SYS CLK and provide the same as an output. In some embodiments, the output is provided to the falling edge control 452. The falling edge control 452, based on an adjustable count number stored in register 466, may provide a falling edge reset signal to AND gate 458 when the output of the n-bit counter 450 equals the adjustable count number stored in the register 466. The adjustable counter number stored in register 466 may be changed to affect the timing of the falling edge reset signal. In some embodiments, the output of the falling edge control 452 may be normally high.

The n-bit counter 454 may be coupled to receive the system clock signal SYS CLK at a timing input and further coupled to receive a reset signal from AND gate 464. The n-bit counter 454 may, between resets at least, count the number of cycles of SYS CLK and provide the same as an output. In some embodiments, the output is provided to the rising edge control 456. The rising edge control 456, based on an adjustable count number stored in register 468, may provide a rising edge reset signal to AND gate 460 when the output of the n-bit counter 454 equals the adjustable count number stored in the register 468. The adjustable counter number stored in register 468 may be changed to affect the timing of the rising edge reset signal. In some embodiments, the output of the rising edge control 456 may be normally high.

By adjusting the timing of both the falling edge and rising edge reset signals, the width of the pulse signal provided by the pulse generator 416 may be adjusted. Additionally, a timing between successive pulses may be adjusted as well. In some embodiments, the pulse signal, which may be continuous or repeating, may include a pulse that is roughly 120 microseconds long followed by a delay of roughly 150 microseconds before a next pulse.

The AND gate 448 may be coupled to receive the non-inverted output Q from D flip flop 444 and the inverted output Q\ from D flip flop 446. The combination of the two outputs may be added together by the AND gate 448 to provide the pulse signal. For example, the rising edge of the pulse signal may be determined by the inverted output Q\ of D flip flop 446, whereas the falling edge of the pulse may be determined by the non-inverted output Q of D flip flop 444. In operation, and for the rising edge, the non-inverted output Q of D flip flop 444 may be high before the inverted output Q\ of D flip flop 446 transitions high. As such, the output of the AND gate 448 may be low until the inverted output Q\ of D flip flop 446 transitions high. For the falling edge, the resetting of D flip flop 444 may form the falling edge of the pulse signal.

The various reset signals, except for the reset signal received by D flip flop 442, may be provided by a respective AND gate. Further, the AND gates 458 through 464 may be also be coupled to receive the system reset signal SYS RST along with a second reset signal. However, since the resets form the D flip flops 442-446, and the n-bit counters 450 and 454 are reset on low, the outputs of the AND gates 458-464 may be normally high, but may transition low if either a system reset occurs or if the other reset signal transitions low. For example, n-bit counter 450 may be reset when the output of D flip flop 444 transitions low. The n-bit counter 454 may be similarly reset based on the non-inverted output of D flip flop 446 transitioning low.

The falling edge reset signal Frst received by D flip flop 444 may be provided by the AND gate 458, and may be based on either a transition to low of SYS RST, or a transition to low of the output of the falling edge control 452. Additionally, the output of the falling edge control 452 may be based on the output of the n-bit counter 450. As such, the output of the falling edge control 452 may transition low based on the count reaching the adjustable count number stored in the register 466. As a result, the n-bit counter 450 may also be reset, which begins the sequence over.

The rising edge reset signal Rrst received by D flip flop 446 may be provided by the AND gate 460, and may be based on either a transition to low of SYS RST, or a transition to low of the output of the rising edge control 456. Additionally, the output of the rising edge control 456 may be based on the output of the n-bit counter 454. As such, the output of the rising edge control 456 may transition low based on the count reaching the adjustable count number stored in the register 468. As a result, the n-bit counter 454 may also be reset, which begins the sequence over.

In operation and in response to a system reset, the outputs of the D flip flops 442, 444 and 446 may be reset. Additionally, the outputs of n-bit counters 450 and 454 may be reset. Upon a next rising edge transition of SYS CLK, the output of D flip flop 442 will transition high, which may cause the non-inverted outputs of D flip flops 444 and 446 to transition high, and the inverted output of the D flip flop 446 will transition high. The high transition of the inverted output of D flip flop 446 may provide a rising edge to the pulse signal since the output of D flip flop 444 coupled to AND gate 448 will be at a high. Upon the falling edge control 452 receiving a count equal to the adjustable count number stored in register 466, a falling edge reset signal may be provided to the AND gate 458, which provides a low transition for Frst to D flip flop 444 in turn. As a result, Frst causes D flip flop 444 to reset, which provides the falling edge of the pulse signal to the AND gate 448. Subsequently, and as long as there is not another system reset, the n-bit counters 450 and 454 may be reset in an alternating manner so that a pulse signal is periodically provided by the AND gate 448.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A current generator, comprising:
   a low dropout regulator (LDO) coupled to receive a reference voltage and provide a reference current in response, wherein the LDO is coupled to receive a calibration signal and adjust a current level of the current reference in response;
   a current controlled oscillator coupled to receive a reference current copy from the LDO and generate an oscillating signal in response, wherein the reference current copy is a replica of the reference current, and wherein a period of the oscillating signal is based at least in part on a level of the reference current copy;
   a pulse generator coupled to receive a clock signal, and provide an adjustable pulse signal in response, wherein timing of a rising edge and a falling edge of the adjustable pulse signal is adjusted in response to a threshold number of system clock periods;
   a counter coupled to be responsive to the oscillating signal and the pulse signal, determine a number of periods of the oscillating signal occurring during a duration of the pulse signal, and provide a control signal indicating the number of periods of the oscillating signal occurring during the duration of the pulse signal; and
   a digital calibration circuit coupled to receive the control signal and provide the calibration signal to the LDO in response.

2. The current generator of claim 1, wherein the current controlled oscillator comprises an odd number of inverters, and wherein the reference current copy is received at a source terminal of a PMOS transistor included in each of the inverters.

3. The current generator of claim 2, wherein the level of the reference current copy affects a latency of each of the inverters, and wherein the latency of each of the odd number of inverters affects the period of the oscillating signal.

4. The current generator of claim 1, wherein the LDO includes a plurality of trim transistors coupled to convert the reference voltage to the reference current, and wherein each one of the plurality of trim transistors is sized differently than the remaining trim transistors of the plurality of trim transistors so that each trim transistor provides a different level of current to the reference current when enabled.

5. The current generator of claim 4, wherein the calibration signal is a six-bit calibration code that determines which trim transistors of the plurality of transistors is enabled.

6. The current generator of claim 1, wherein the pulse generator comprises:
   a first D flip flop coupled to receive the reference clock at a first timing input and coupled to a logic high at a first data input, and to provide a first output in response;
   a second D flip flop coupled to receive the first output at a second timing input and coupled to the logic high at a second data input, and to provide a second output in response;
   a third D flip flop coupled to receive the first output at a third timing input, and coupled to the high reference voltage at a third data input, and to provide a third output in response; and
   a logic gate coupled to receive the second and third outputs and provide the pulse signal in response, wherein the second output controls timing of the falling edge of the pulse signal, and the third output signal controls timing of the rising edge of the pulse signal.

7. The current generator of claim 6, wherein the pulse generator further comprises:

a second counter coupled to receive the reference clock at a timing input and a first reset signal at a reset input, and to provide a first count in response;
a third counter coupled to receive the reference clock at a timing input and a second rest signal at a reset input, and to provide a second count in response;
a falling edge control coupled to receive the first count and provide a first reset signal in response; and
a rising edge control coupled to receive the second count and provide a second reset signal in response,
wherein the first reset signal is received by the second D flip flop to control the timing of the falling edge of the pulse signal, and
wherein the second reset signal is received by the third D flip flop to control the timing of the rising edge of the pulse signal.

8. An apparatus, comprising:
a voltage converter coupled to receive a reference voltage, and provide a reference current in response, wherein the voltage converter includes a plurality of trim transistors coupled to receive a respective bit of a calibration word, and wherein a level of the reference current is generated from the reference voltage in response to the number of trim transistors enabled;
a current controlled oscillator coupled to receive the reference current and provide an oscillating signal in response, wherein a period of the oscillating signal is based on the level of the reference current; and
a digital calibration coupled to receive a count indicative of a number of periods of the oscillating signal that occur during a pulse signal, and provide the calibration word in response.

9. The apparatus of claim 8, wherein the current controlled oscillator includes:
a plurality of inverters coupled as a ring oscillator, wherein each of the plurality of inverters includes a PMOS transistor and an NMOS transistor, and wherein the PMOS transistor is coupled to receive the reference current at a source.

10. The apparatus of claim 9, wherein the level of the reference current affects the latency of each of the plurality of inverters, and wherein the latency affects the period of the oscillating signal.

11. The apparatus of claim 9, wherein the level of the reference current affects the rise and fall time of the PMOS and the NMOS transistors, and wherein the rise and fall times affects the period of the oscillating signal.

12. The apparatus of claim 8, wherein the voltage inverter includes:
a low dropout regulator coupled to receive the reference voltage and generate the reference current in response, wherein the low dropout regulator includes the plurality of trim transistors coupled to provide the reference current to a voltage divider, and wherein a voltage level of the voltage divider is coupled to an input of an amplifier that compares the voltage level of the voltage divider to the reference voltage; and
a plurality of current mirrors to mirror the reference current and provide the reference current at least to the current controlled oscillator.

13. The apparatus of claim 8, further comprising:
a pulse generator coupled to receive a clock signal, and provide the pulse signal in response, wherein timing of a rising edge and a falling edge of the pulse signal are generated in response to a respective threshold number of system clock periods.

14. The apparatus of claim 8, further comprising:
a counter coupled to receive the oscillating signal and the pulse signal via an AND gate, determine a number of periods of the oscillating signal occurring during a duration of the pulse signal, and provide the count indicative of the number of periods of the oscillating signal that occur during the pulse signal, wherein the count further indicates a deviation from a threshold number of periods of the oscillating signal.

15. The apparatus of claim 8, wherein the calibration word is six bits, and each bit enables and disables a respective one of the plurality of trim transistors.

16. An imaging system, comprising:
an array of pixels coupled to generate image data in response to image light;
readout circuitry coupled to receive the image data and perform one or more operations on the image data, the readout circuitry including a current generator coupled to provide a reference current, wherein the reference current provides an operating point for the one or more operations, and wherein the current generator comprises:
a low dropout regulator (LDO) coupled to receive a reference voltage, and provide a reference current in response, wherein the LDO includes a plurality of trim transistors coupled to receive a respective bit of a calibration word, and wherein a level of the reference current is generated from the reference voltage in response to the number of trim transistors enabled;
a current controlled oscillator coupled to receive the reference current and provide an oscillating signal in response, wherein a period of the oscillating signal is based on the level of the reference current; and
a digital calibration coupled to receive a count indicative of a number of periods of the oscillating signal occurring during a pulse signal, and provide the calibration word in response.

17. The imaging system of claim 16, wherein the current controlled oscillator includes:
a plurality of inverters coupled as a ring oscillator, wherein each of the plurality of inverters includes a PMOS transistor and an NMOS transistor, and wherein the PMOS transistor is coupled to receive the reference current at a source.

18. The imaging system of claim 17, wherein the level of the reference current affects the latency of each of the plurality of inverters, and wherein the latency affects the period of the oscillating signal.

19. The imaging system of claim 16, further comprising:
a plurality of current mirrors to mirror the reference current and provide the reference current at least to the current controlled oscillator.

20. The imaging system of claim 16, further comprising:
a pulse generator coupled to receive a clock signal, and provide the pulse signal in response, wherein timing of a rising edge and a falling edge of the pulse signal are generated in response to a respective threshold number of system clock periods; and
a counter coupled to receive the oscillating signal and the pulse signal via an AND gate, determine a number of periods of the oscillating signal occurring during a duration of the pulse signal, and provide the count indicative of the number of periods of the oscillating signal that occur during the pulse signal, wherein the count further indicates a deviation from a threshold number of periods of the oscillating signal.

* * * * *